United States Patent
Huang et al.

(10) Patent No.: US 6,271,120 B1
(45) Date of Patent: Aug. 7, 2001

(54) METHOD OF ENHANCED SILICIDE LAYER FOR ADVANCED METAL DIFFUSION BARRIER LAYER APPLICATION

(75) Inventors: Richard J. Huang, Milpitas; Robin W. Cheung, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 08/402,252

(22) Filed: Mar. 10, 1995

(51) Int. Cl.[7] .................................................. H01L 21/4763
(52) U.S. Cl. ........................ 438/627; 438/630; 438/633; 438/663
(58) Field of Search ..................................... 437/190, 192, 437/195, 200; 438/627, 629, 630, 633, 663, 664

(56) References Cited

U.S. PATENT DOCUMENTS

| | | | |
|---|---|---|---|
| 4,701,349 | * 10/1987 | Koyanagi et al. | 437/241 |
| 4,772,571 | * 9/1988 | Scovell et al. | 437/200 |
| 4,994,410 | * 2/1991 | Sun et al. | 437/192 |
| 5,124,780 | * 6/1992 | Sandhu et al. | 437/192 |
| 5,141,897 | * 8/1992 | Manocha et al. | 437/228 |
| 5,258,333 | * 11/1993 | Shappir et al. | 437/235 |
| 5,266,521 | * 11/1993 | Lee et al. | 437/188 |
| 5,272,666 | * 12/1993 | Tsang et al. | 437/192 |

* cited by examiner

Primary Examiner—T. N. Quach
(74) Attorney, Agent, or Firm—Sawyer Law Group LLP

(57) ABSTRACT

A rapid thermal anneal (>600° C.) in a nitrogen-containing atmosphere is used to form a barrier TiN layer at the bottom of contact openings. To form source and drain contacts, contact openings are etched in a dielectric down to a titanium silicide layer on top of doped regions in the semiconductor (i.e. polysilicon or doped regions in the semiconductor substrate). The barrier TiN layer on the bottom of the contact openings is provided by a rapid thermal anneal in a nitrogen-containing atmosphere which converts the top part of the titanium silicide layer in the contact openings into a barrier TiN layer. This nitrogen-containing atmosphere contains nitrogen-containing species (e.g., $N_2$, $NH_3$, $N_2O$) that react with titanium silicide to form TiN under the conditions provided by the rapid thermal anneal.

4 Claims, 1 Drawing Sheet

METHOD OF ENHANCED SILICIDE LAYER FOR ADVANCED METAL DIFFUSION BARRIER LAYER APPLICATION

CROSS-REFERENCE TO RELATED APPLICATION

This application is related to the application Ser. No. 08/402,254, U.S. Pat. No. 5,625,231, filed on even date herewith. That application concerns the process involving the application of an adhesion layer on high aspect ratio contact/via openings in a dielectric. The present application is directed to the use of a rapid thermal anneal in a nitrogen-containing atmosphere to form a barrier TiN layer at the bottom of contact openings.

TECHNICAL FIELD

The present invention relates generally to semiconductor processing, and, more particularly, to improving the electrical integrity of contacts comprising metals deposited by physical vapor deposition (PVD) or chemical vapor deposition (CVD) during processing of sub-half micrometer semiconductor devices.

BACKGROUND ART

The present integrated circuit devices comprise a silicon substrate, doped regions in the semiconductor to which source or drain connections are made, separated by a gate control region. Metal connections to the source, gate, and drain electrodes are made by multilayer interconnects, which are supported over the substrate by an interlayer dielectric. To make electrical connection between different layers, the dielectric is sequentially patterned and etched to form contact openings. These opening are filled with plugs of an electrically conductive material such as aluminum. Some plugs contact a polysilicon layer which is formed over a thin oxide gate layer and these plugs become gate electrodes. Other plugs contact previously-doped regions in the semiconductor substrate and become source or drain contacts.

In the case where source and drain contacts are to be made, a titanium silicide layer is formed on the doped regions by use of a rapid thermal anneal. To support multilayer interconnects, an interlayer dielectric comprising of oxide is deposited on the surface and contact openings are etched in the interlayer dielectric.

The current practice in the industry is to deposit a Ti/TiN layer onto the titanium silicide layer after the contact openings are formed. The Ti/TiN layer serves as a barrier TiN layer that protects the junctions below. The formation of a barrier TiN layer is needed to prevent junction spiking caused by diffusion of metal from the plugs into the junctions. The minimum thickness of the barrier TiN layer depends on the device. Presently, physical vapor deposition (PVD) or chemical vapor deposition (CVD) is employed to deposit the barrier TiN layer.

What is needed is an improved process for forming a barrier TiN layer at the bottom of the contact opening.

DISCLOSURE OF INVENTION

In accordance with the invention, the top portion of the titanium silicide layer is converted into a barrier TiN layer of sufficient thickness. No additional mask is required to form the barrier TiN layer.

The process of forming a barrier TiN layer comprises converting the top portion of a titanium silicide layer into a layer of titanium nitride by exposing the titanium silicide layer to a rapid thermal anneal in a nitrogen-containing atmosphere.

In the case where source and drain contacts are to be made, contact openings are etched in the interlayer dielectric down to doped regions in the semiconductor (i.e., polysilicon or doped regions in the substrate). As described above, these doped regions have a titanium silicide layer on top. The barrier TiN layer on the bottom of the contact openings is provided by a rapid thermal anneal in a nitrogen-containing atmosphere which converts the top portion of the titanium silicide layer in the contact openings into a barrier TiN layer. This nitrogen-containing atmosphere contains a nitrogen-containing species (e.g., $N_2$, $NH_3$, $N_2O$) that reacts with titanium silicide to form TiN under the conditions provided by a rapid thermal anneal.

Typically, the formation of the barrier TiN layer is followed by high temperature aluminum sputtering, regular aluminum sputtering followed by high temperature reflow, or chemical vapor deposition of aluminum. (High temperature reflow of aluminum involves a high temperature anneal (>450° C.) to flow the aluminum into the contact opening.) The aluminum plug is then formed by chemical-mechanical polishing or etchback.

Plugs comprised of other metals may also be used in place of aluminum. Examples of such metals include CVD metals, i.e., CVD-copper, CVD-gold and CVD-tungsten.

Other objects, features, and advantages of the present invention will become apparent upon consideration of the following detailed description and accompanying drawings, in which like reference designations represent like features throughout the Figures.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

BEST MODES FOR CARRYING OUT THE INVENTION

Reference is now made in detail to a specific embodiment of the present invention, which illustrates the best mode presently contemplated by the inventors for practicing the invention. Alternative embodiments are also briefly described as applicable.

The present invention is directed to the process involving the formation a barrier TiN layer at the bottom of contact openings in a dielectric. To make electrical connection between different layers of an integrated circuit, these contact openings are filled with plugs of an electrically conductive material such as aluminum, which contacts previously-doped regions, or polysilicon. This electrically conductive material may also comprise other metals such as copper, gold, and tungsten.

Figure 1A:
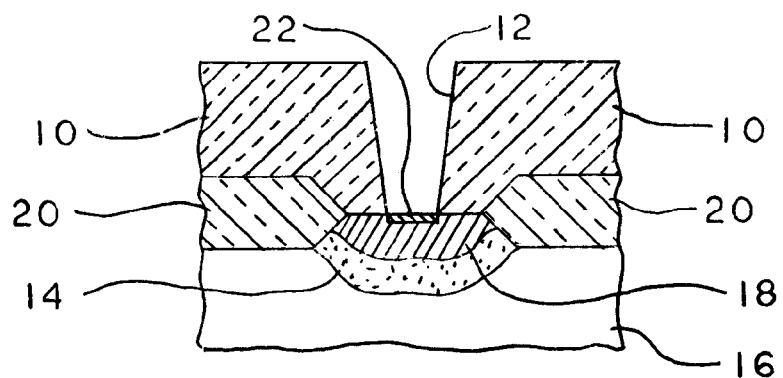
FIGS. 1a–1c are cross-sectional views depicting a contact level process flow and the resulting structure.
Figure 1B:
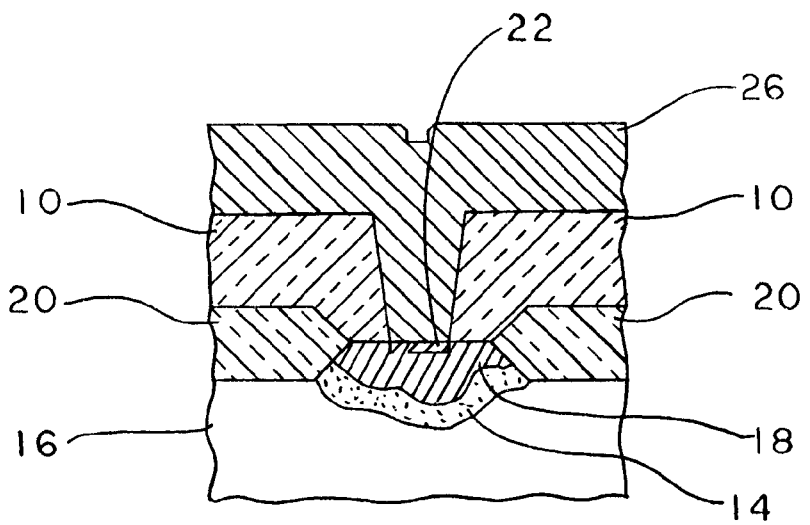
Figure 1C:
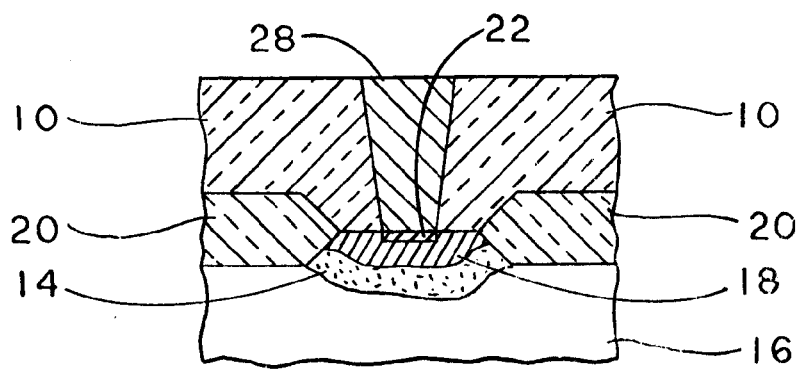

In the case where source and drain contacts are to be made, contact openings are etched in the interlayer dielectric down to the doped regions in the semiconductor (i.e., polysilicon or doped regions in the semiconductor substrate). As described above, these doped regions have a titanium silicide layer on top. A contact level process flow is depicted in FIGS. 1a–1c. FIG. 1a shows a region of the integrated circuit where a portion of an interlayer dielectric 10 has been etched to form a contact opening 12 over a doped region 14 in a semiconductor substrate 16. While one such contact opening 12 is shown, it will be readily apparent to those skilled in this art that in fact a plurality of such contact openings are formed. The interlayer dielectric 10 has been etched down to a titanium silicide layer 18, formed on the doped region 14 which resides between field oxide regions 20. After the contact etch, a rapid thermal anneal (RTA) of at least about 600° C. in a nitrogen-containing atmosphere is used to convert the top portion of the titanium silicide layer 18 in the contact opening 12 into a barrier TiN layer 22. The nitrogen-containing atmosphere contains at least one nitrogen-containing species that reacts with titanium silicide to form TiN under the conditions provided by the RTA. Examples of the nitrogen-containing atmosphere include $N_2$, $NH_3$, or $N_2O$; however, other nitrogen-containing species may also be employed in the practice of the invention. Due to the relatively high temperature cycle provided by the RTA, the overall thermal budget for the junction should be considered and optimized. The thickness of the barrier TiN layer 22 is device-dependent. However, in any event, it should be thick enough to be free of pinholes and to prevent diffusion of aluminum therethrough to underlying silicon.

Once the barrier TiN layer 22 has been formed by RTA, an aluminum layer 26 is deposited. The formation of the aluminum layer 26 is achieved by high temperature aluminum sputtering, regular aluminum sputtering followed by high temperature reflow, or chemical vapor deposition of aluminum. (High temperature reflow of aluminum involves a high temperature anneal (>450° C.) to flow the aluminum into the contact opening.) FIG. 1b illustrates the structure of the device at this stage of processing. FIG. 1c depicts an aluminum plug 28 formed by chemical-mechanical polishing (CMP) or plasma etchback. The chemical-mechanical polishing (CMP) or plasma etchback is employed to remove the aluminum outside of the contact opening 12.

The barrier TiN layer 22 serves to prevent junction spiking caused by the diffusion of aluminum from the aluminum plug 28 into the junction. The barrier TiN layer 22 that was formed in the previous RTA step and which is now at the bottom of the contact opening 12, provides good contact resistance and junction protection.

Industrial Applicability

The process of the invention for converting a titanium silicide layer into a titanium nitride layer is expected to find use in the fabrication of silicon-based semiconductor devices.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bi-polar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process of forming a barrier titanium nitride layer in contact openings etched in a dielectric layer supported over a semiconductor substrate, said process comprising:

(a) etching said contact openings in said dielectric layer down to a titanium silicide layer, each of said contact openings having a bottom;

(b) forming said barrier titanium nitride layer at said bottom of said contact openings by converting at least a portion of said titanium silicide layer at said bottom of said contact openings into said barrier titanium nitride layer by exposing said titanium silicide layer to a rapid thermal anneal performed at a temperature of at least about 600° C. in a nitrogen-containing atmosphere comprising a nitrogen-containing species selected from the group consisting of $N_2$, $NH_3$, and $N_2O$;

(c) providing blanket deposition of a metal by employing a process selected from the group consisting of high temperature metal sputtering, regular metal sputtering followed by high temperature reflow, and chemical vapor deposition of said metal, to form a layer thereof; and (d) removing metal outside of said contact openings via chemical-mechanical polishing or plasma etchback of said layer of metal thereby forming a metal plug in each of said contact openings consisting essentially of a metal selected from the group consisting of aluminum, copper, and gold.

2. The process of claim 1 wherein the thickness of said barrier titanium nitride layer is device-dependent.

3. The process of claim 1 wherein a metal plug is formed in said contact openings, said process comprising:

(a) providing blanket deposition of a metal by employing a process selected from the group consisting of high temperature metal sputtering, regular metal sputtering followed by high temperature reflow, and chemical vapor deposition of said metal, to form a layer thereof, said metal plug consisting essentially of a metal selected from the group consisting of aluminum, tungsten, copper, and gold; and (b) removing metal outside of said contact openings via chemical-mechanical polishing or plasma etchback of said layer of metal.

4. A process of forming a barrier titanium nitride layer in contact openings etched in a dielectric layer supported over a semiconductor substrate, each of said contact openings having a bottom, said process comprising:

(a) forming said barrier titanium nitride layer at said bottom of said contact openings by (i) etching said contact openings in said dielectric layer down to a titanium silicide layer, and (ii) converting at least a portion of said titanium silicide layer at said bottom of said contact openings into said barrier titanium nitride layer by exposing said titanium silicide layer to a rapid thermal anneal performed at a temperature of at least about 600° C. in a nitrogen-containing atmosphere comprising a nitrogen-containing species selected from the group consisting of $N_2$, $NH_3$, and $N_2O$; and (b) forming a metal plug in said contact openings by (i) providing blanket deposition of a metal by employing a process selected from the group consisting of high temperature metal sputtering, regular metal sputtering followed by high temperature reflow, and chemical vapor deposition of said metal, to form a layer thereof, said metal plug consisting essentially of a metal selected from the group consisting of copper and gold, and (ii) removing metal outside of said contact openings via chemical-mechanical polishing or plasma etchback of said layer of metal.

* * * * *